(12) United States Patent
Ishida et al.

(10) Patent No.: US 9,040,831 B2
(45) Date of Patent: May 26, 2015

(54) MANUFACTURING METHOD FOR PRINTED CIRCUIT BOARD

(71) Applicant: INTERNATIONAL BUSINESS MACHINES CORPORATION, Armonk, NY (US)

(72) Inventors: Mitsuya Ishida, Ritto (JP); Hiroyuki Mori, Nagahara (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 71 days.

(21) Appl. No.: 14/023,965

(22) Filed: Sep. 11, 2013

(65) Prior Publication Data

US 2014/0083743 A1    Mar. 27, 2014

(30) Foreign Application Priority Data

Sep. 27, 2012    (JP) .................. 2012-214773

(51) Int. Cl.
| | |
|---|---|
| H05K 1/02 | (2006.01) |
| H05K 3/46 | (2006.01) |
| H05K 3/06 | (2006.01) |
| H05K 3/00 | (2006.01) |
| H05K 3/40 | (2006.01) |

(52) U.S. Cl.
CPC ............ *H05K 1/0284* (2013.01); *H05K 1/0298* (2013.01); *H05K 3/46* (2013.01); *H05K 3/06* (2013.01); *H05K 3/0097* (2013.01); *H05K 3/0052* (2013.01); *H05K 3/403* (2013.01); *H05K 3/4661* (2013.01); *H05K 3/4682* (2013.01)

(58) Field of Classification Search
CPC ........................... H05K 1/0284; H05K 3/0097
See application file for complete search history.

(56) References Cited

FOREIGN PATENT DOCUMENTS

| | | |
|---|---|---|
| JP | 2884669 | 11/1991 |
| JP | 3432982 | 6/1997 |
| JP | 2009-295620 | 12/2009 |

*Primary Examiner* — Jeremy C Norris
(74) *Attorney, Agent, or Firm* — Matthew C. Zehrer

(57) ABSTRACT

A printed circuit board is manufactured by forming on a top surface of a support base, in a pattern having a predetermined width, a first metal layer for defining boundary ends between adjacent printed circuit boards in a printed circuit board assembly, forming on top of the first metal layer a wiring structure portion having an insulating layer and a conductive layer for each printed circuit board in the printed circuit board assembly, forming, in the wiring structure portion, grooves having a pattern corresponding to the pattern of the first metal layer to expose the first metal layer, forming a second metal layer on the wall surface of the grooves in the wiring structure portion, and cutting the first metal layer on the bottom surface of the grooves to separate each printed circuit board.

8 Claims, 10 Drawing Sheets

MANUFACTURING METHOD FOR PRINTED CIRCUIT BOARD

FIELD

Embodiments of the present invention relate to the manufacture of a printed circuit board and, more specifically, to a manufacturing method for a printed circuit board comprising metallic peripheral side surfaces.

DESCRIPTION OF THE RELATED ART

Thin printed circuit boards made of organic materials are usually fragile. In particular, board cracking in the end surfaces (e.g. peripheral side surfaces, etc.), when the circuit wiring is itself cut, may induce chemicals and water seeping into cracks during subsequent manufacturing steps and may cause corrosion of the circuitry of the board.

In order to counter cracking of board end surfaces, the effective region in which wiring can be used is limited to the inside, for example, a certain width (approximately 500 μm) from the periphery of the end of the board. This prevents severing and corrosion of circuit wiring, even when cracking occurs on the board end surfaces. While this countermeasure can prevent the severing and corrosion of circuit wiring, it reduces the area of the effective region on the board, and inhibits full use of the board surface.

SUMMARY

Embodiments of the present invention relate to the manufacture of a printed circuit board and, more specifically, to a manufacturing method for a printed circuit board comprising metallic peripheral side surfaces.

In an embodiment of the present invention a manufacturing method for a printed circuit board includes forming on a top surface of a support base, in a pattern having a predetermined width, a first metal layer for defining boundary ends between adjacent printed circuit boards in a printed circuit board assembly, forming on top of the first metal layer a wiring structure portion having an insulating layer and a conductive layer for each printed circuit board in the printed circuit board assembly, forming, in the wiring structure portion, grooves having a pattern corresponding to the pattern of the first metal layer to expose the first metal layer, forming a second metal layer on the wall surface of the grooves in the wiring structure portion, and cutting the first metal layer on the bottom surface of the grooves to separate each printed circuit board.

In certain embodiments, forming the grooves in the wiring structure portion includes forming the grooves in the wiring structure portion using a laser drill. In certain embodiments, forming the second metal layer on the wall surface of the grooves in the wiring structure portion further includes: forming metal film on the inside surface of the grooves and on the surface of the wiring structure portion using electroless metal plating, forming on the metal film a mask layer having an opening in the grooves, forming the second metal layer on the metal film inside the grooves using electrolytic metal plating, and removing the mask layer, and removing the metal film by etching the entire metal surface. In certain embodiments, cutting the first metal layer on the bottom surface of the grooves to separate each printed circuit board includes piece-cutting the first metal film using a dicer.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Embodiments of the present invention relate to the manufacture of a printed circuit board and, more specifically, to a manufacturing method for a printed circuit board comprising metallic peripheral side surfaces.

Figure 1:
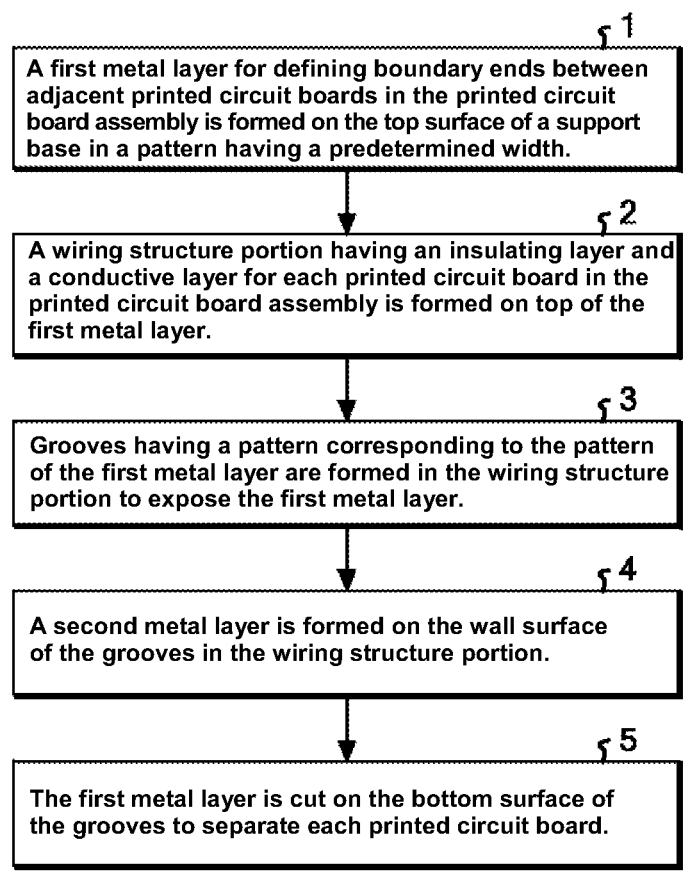
FIG. 1 is a diagram schematically showing the printed circuit board manufacturing method, according to various embodiments of the present invention.

FIG. 1 is a diagram schematically showing a printed circuit board manufacturing method according to various embodiments of the present invention. In certain embodiments, the printed circuit board is manufactured as a printed circuit board assembly including a plurality of printed circuit boards.

The printed circuit board manufacturing method may include, as depicted in block 1, forming a first metal layer for defining boundary ends between adjacent printed circuit boards in the printed circuit board assembly on the top surface of a support base using a pattern having a predetermined width.

The printed circuit board manufacturing method may include, as depicted in block 2, forming a wiring structure portion having an insulating layer and a conductive layer for each printed circuit board in the printed circuit board assembly on top of the first metal layer.

The printed circuit board manufacturing method may include, as depicted in block 3, forming grooves having a pattern corresponding to the pattern of the first metal layer in the wiring structure portion to expose the first metal layer.

The printed circuit board manufacturing method may include, as depicted in block 4, forming a second metal layer on the bottom surface of the grooves in the wiring structure portion. In certain embodiments, the peripheral side surfaces of each printed circuit board may be coated by the second metal layer.

The printed circuit board manufacturing method may include, as depicted in block 5, cutting the first metal layer on the bottom surface of the grooves to separate each printed circuit board. In this way, individual printed circuit boards are manufactured.

Figure 2:
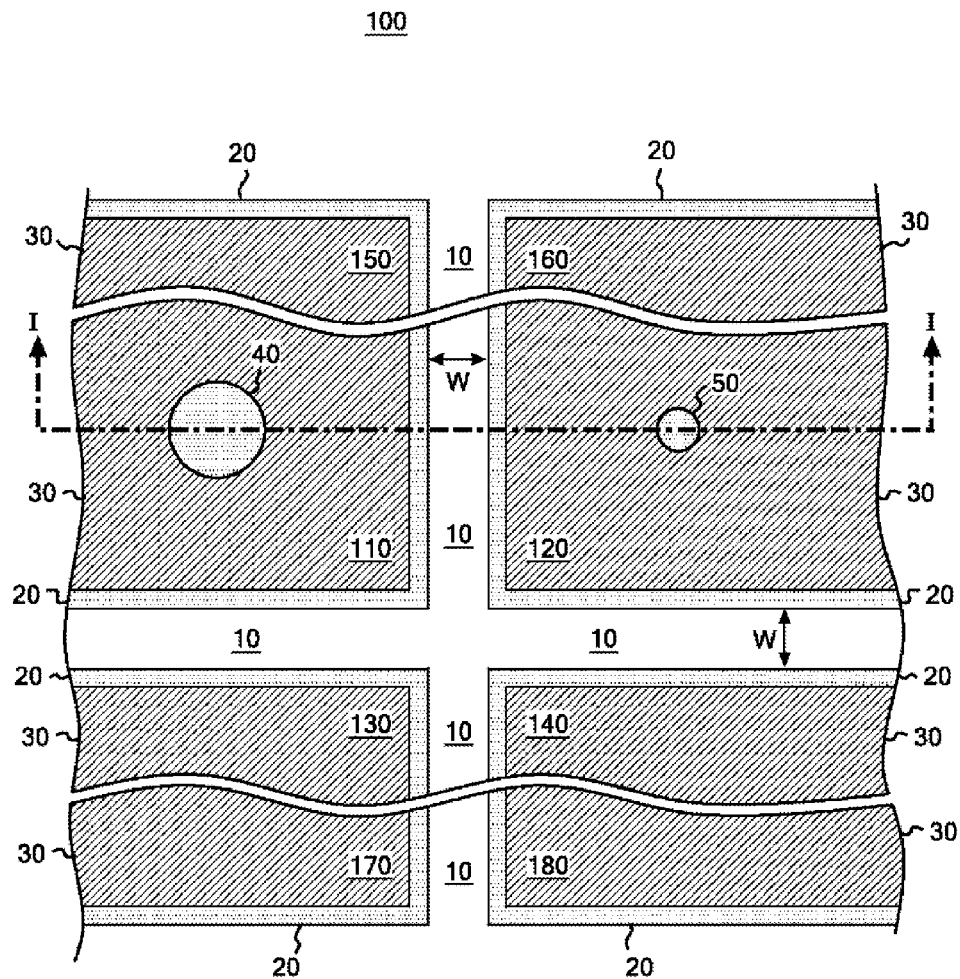
FIG. 2 is a partial plane view showing a portion of the top surface of a printed circuit board assembly, according to various embodiments of the present invention.

FIG. 2 is a partial plan view showing a portion of the top surface of a printed circuit board assembly 100. The printed circuit board assembly 100 includes a plurality of printed circuit boards 110, 120, 130, 140, 150, 160, 170, 180. Printed circuit board assembly 100 may also include other circuit boards (not shown). The printed circuit boards 110, 120, 130, 140, etc. in the middle of the printed circuit board assembly 100 and not on the periphery are separated from adjacent printed circuit boards by grooves 10 provided on the periphery or boundary edges. The printed circuit boards 150, 160, 170, 180 on the periphery of the printed circuit board assembly 100 are separated from adjacent printed circuit board by grooves 10 provided on the periphery or boundary edges with other printed circuit boards. The grooves 10 are formed with a predetermined width W that allows adjacent printed circuit boards to be cut and separated into individual boards.

A metal layer 20 is formed on the inner wall and open ends of the grooves 10. The inner walls of the grooves 10 form the peripheral side surfaces of individual printed circuit boards after cutting. Therefore, the peripheral side surfaces of each printed circuit board are coated with a metal layer 20. A protective film 30 such as a solder protective film is formed on the surface of each printed circuit board. Openings 40, 50 are formed in the protective film 30 of printed circuit boards 110 and 120, respectively, and these are used to establish an electrical connection to devices mounted there.

Figure 3:
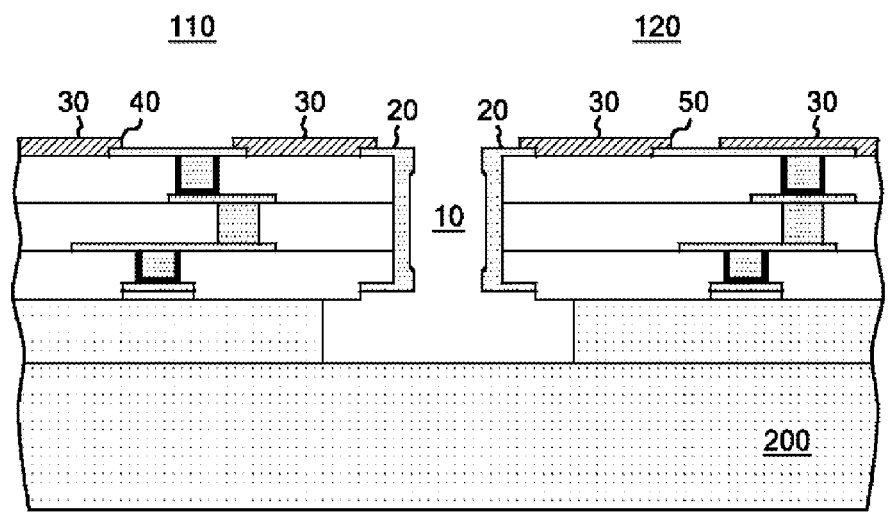
FIG. 3 is a partial cross-sectional view along line I-I as shown in FIG. 2, according to various embodiments of the present invention.

FIG. 3 shows a partial cross-sectional view along line I-I as shown in FIG. 2. The printed circuit boards 110, 120 are supported by a dicer stage 200. The metal layer 20 formed on the inner walls of the grooves 10 coat the peripheral side surfaces of printed circuit boards 110 and 120. Printed circuit boards 110 and 120 have a wiring structure portion further described. The wiring structure portion has three layers. The conductive layers formed inside each insulating layer are connected to each other via a conductive core formed inside each insulating layer.

Figure 4A:
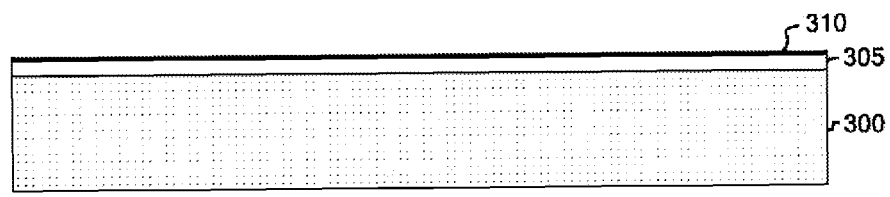
FIG. 4A-FIG. 4T are partial cross-sectional views showing various processes to manufacture a printed circuit board, according to various embodiments of the present invention.
Figure 4B:
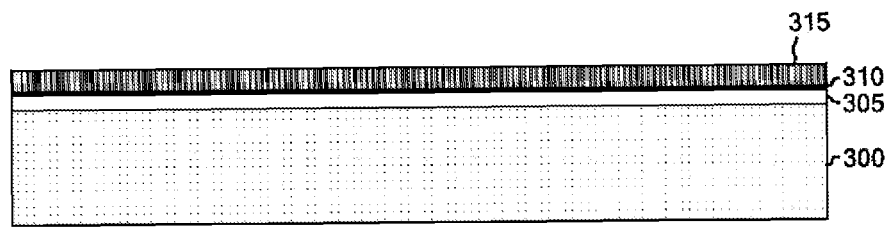
Figure 4C:
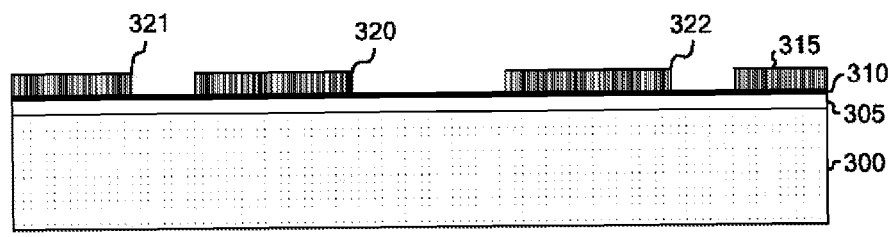
Figure 4D:
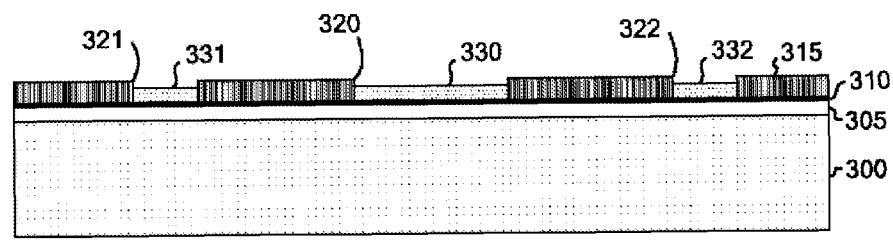
Figure 4E:
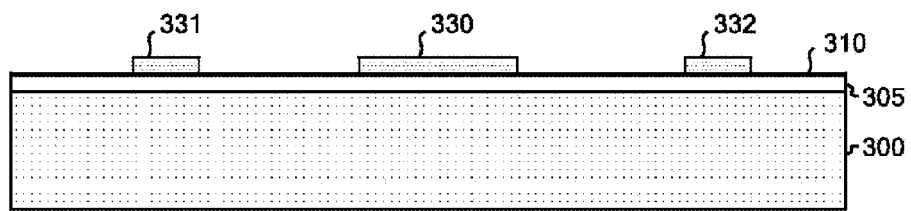
Figure 4F:
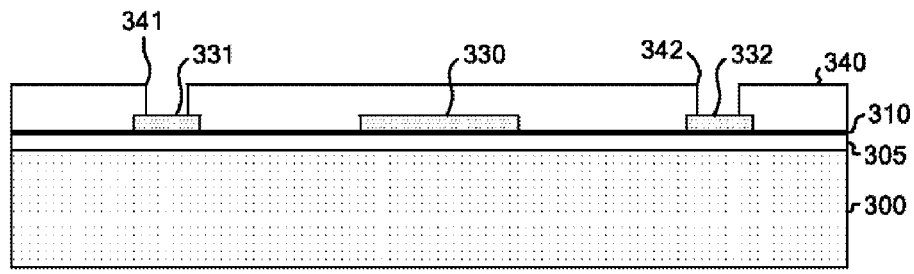
Figure 4G:
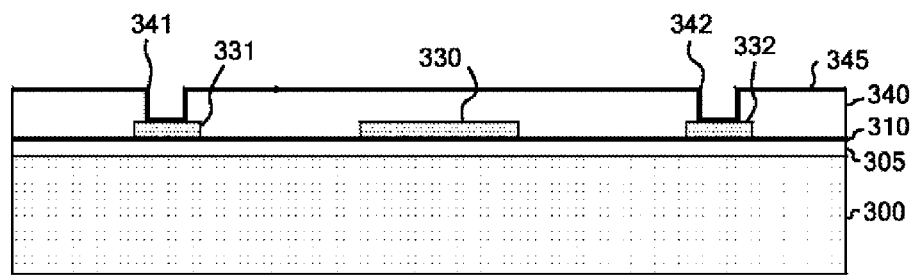
Figure 4H:
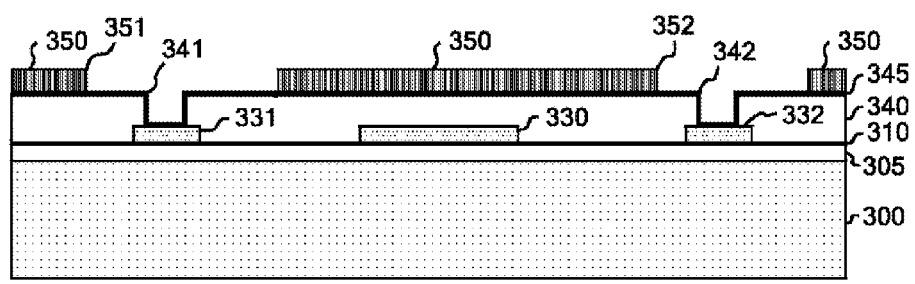
Figure 4I:
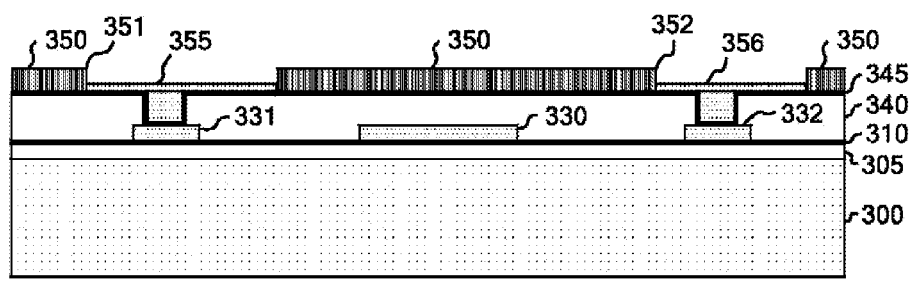
Figure 4J:
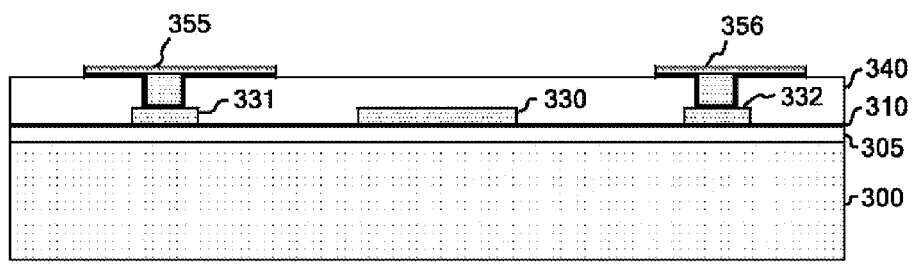
Figure 4K:
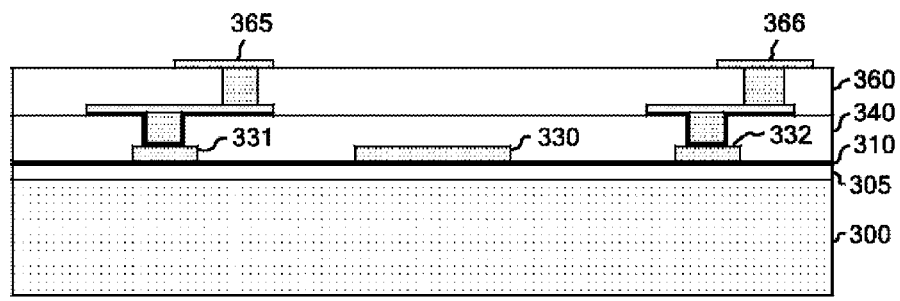
Figure 4L:
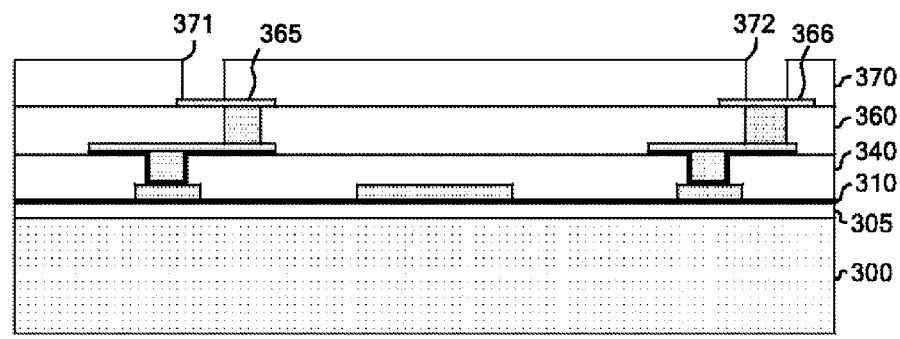
Figure 4M:
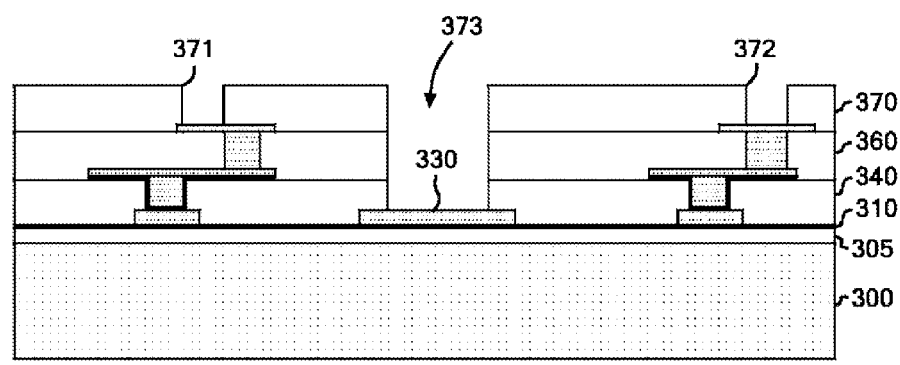
Figure 4N:
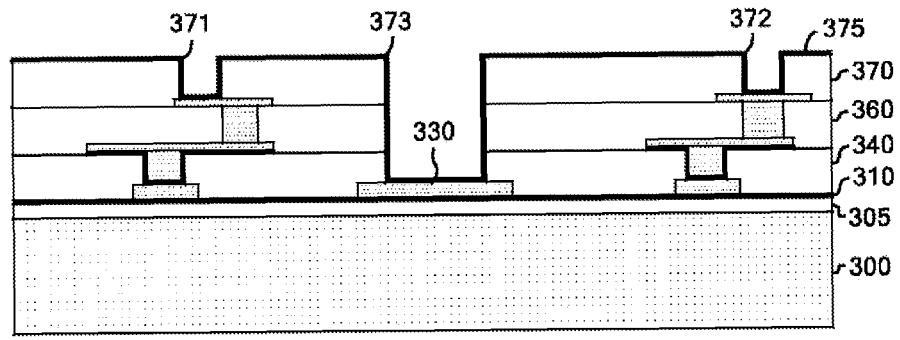
Figure 4O:
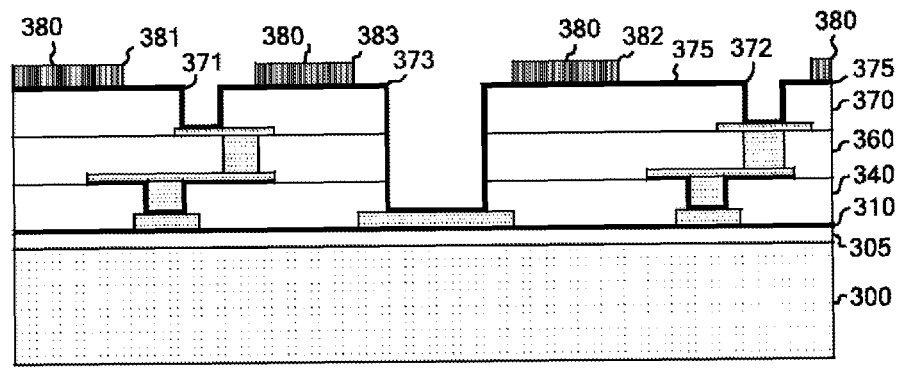
Figure 4P:
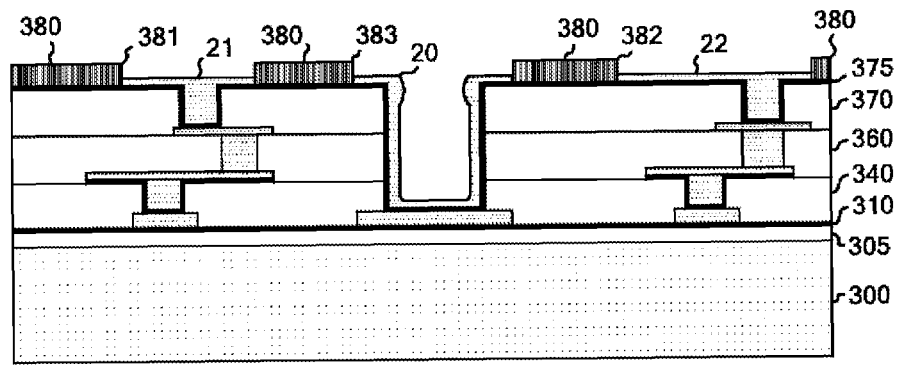
Figure 4Q:
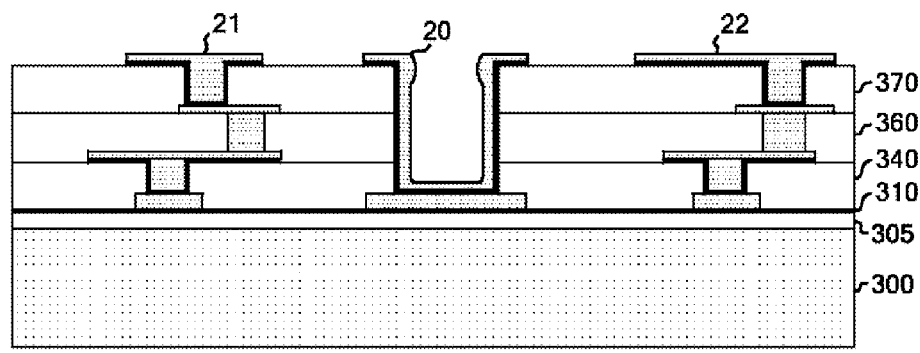
Figure 4R:
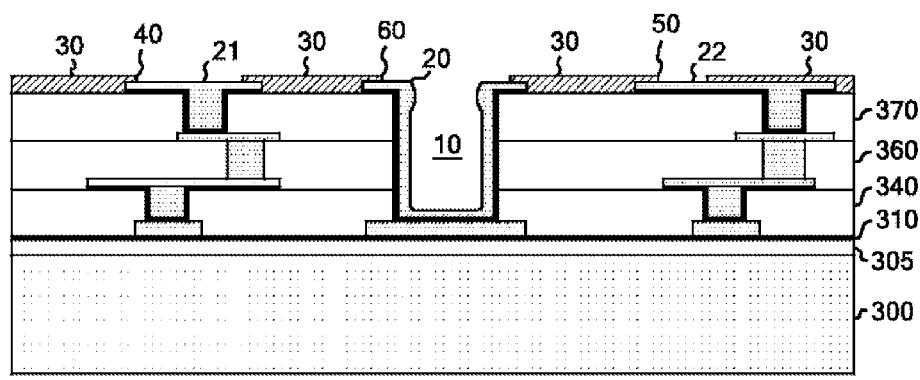
Figure 4S:
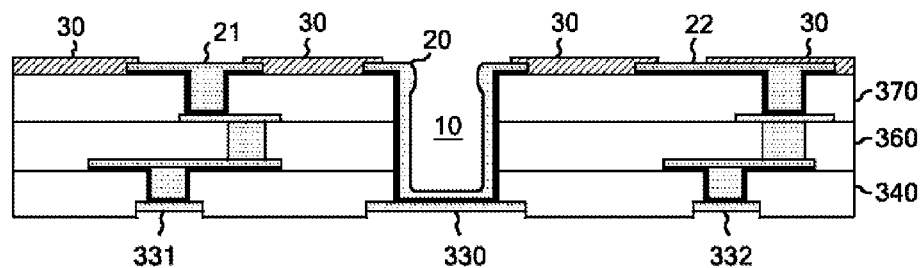
Figure 4T:
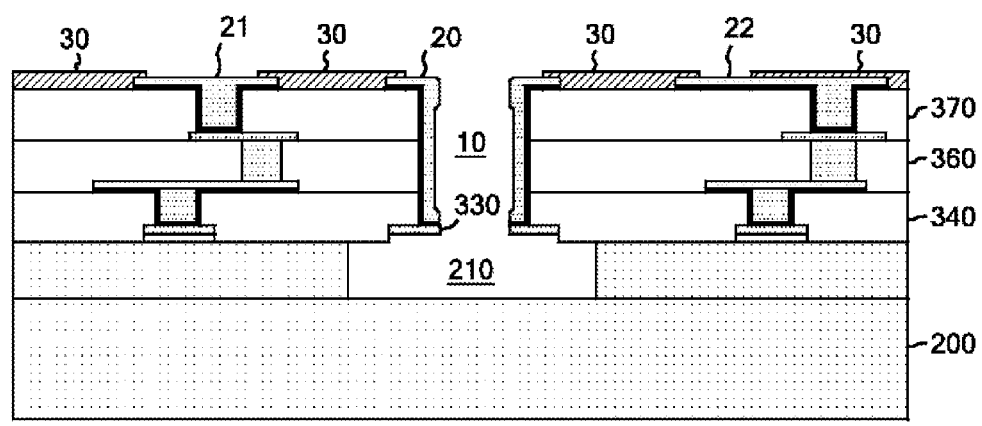

FIG. 4A through FIG. 4T show how the printed circuit boards 110, 120 in FIG. 2 and FIG. 3 are manufactured. A release layer 305 is formed on the top surface of the support base 300 used to support the printed circuit boards to be manufactured. A metal film 310 such as a copper film is formed on top of the release layer 305 (FIG. 4A). A mask layer 315 such as dry film is adhered to the top of the metal film 310 (FIG. 4B). The mask layer 315 is exposed and developed, and a predetermined pattern is formed which has an opening 320 of a predetermined width corresponding to the predetermined width W of the grooves 10 where the grooves 10 are to be formed, and has openings 321, 322 of a predetermined size formed where the conductive core is to be formed (FIG. 4C).

A metal plating such as electrolytic copper plating is performed to adhere metal layers 330, 331, 332 to the openings 320, 321, 322 in the mask layer 315, respectively (FIG. 4D). The mask layer 315 is removed, a metal layer 330 of a predetermined width is formed where the grooves 10 are to be formed, and metal layers 331, 332 of a predetermined size are formed where the conductive core is to be formed (FIG. 4E).

A first insulating layer 340, serving as a first level layer, is adhered on top of the metal layers 330, 331 and 332. Openings 341, 342 are formed using, for example, a laser drill in the first insulating layer 340 where metal layers 331, 332 are located (FIG. 4F). Then, for example, metal plating such as electroless copper plating is performed to adhere metal film 345 to the surface of the first insulating layer 340 and to the inside surfaces of the openings 341, 342 (FIG. 4G).

A mask layer 350 such as dry film is adhered to the top of the metal film 345. The mask layer 350 is exposed and developed, and a predetermined pattern with openings 351, 352 is formed where there are openings 341, 342 to form the conductive core (FIG. 4H).

Metal plating such as electrolytic copper plating is performed to adhere metal film 355, 356, each having a conductive core, to the openings 351, 352 in the mask layer 350 (FIG. 4I). The mask layer 350 is removed, and metal film 345 is removed, for example, by etching the entire metal surface using flash etching. At this time, metal layers 355 and 356 are etched but remain. This forms metal layers 355, 356 with a conductive core (FIG. 4J).

The process is repeated from FIG. 4F to FIG. 4J to form a wiring layer to serve as a second level layer, and to form metal layers 365, 366 on a second insulating layer 360 (FIG. 4K). A third insulating layer 370 serving as a third level layer is adhered on top of the metal layers 365, 366, and openings 371, 372 are formed in the third insulating layer 370 where the metal layers 365, 366 are formed, respectively, using, for example, a laser drill (FIG. 4L).

An opening 373 is formed using, for example, a laser drill in the third insulating layer 370 where the groove 10 is to be formed. This opening 373 is also formed in the second insulating layer 360 and the first insulating layer 340 to expose the metal layer 330 (FIG. 4M). Then, for example, metal plating such as electroless copper plating is performed to adhere metal film 375 to the surface of the third insulating layer 370 and to the inside surfaces of the openings 371, 372, 373 (FIG. 4N).

A mask layer 380 such as dry film is adhered to the top of the metal film 375, the mask layer 380 is exposed and developed, and a predetermined pattern is formed which has openings 381, 382 formed where there are openings 371, 372 to form the conductive core, and an opening 383 where there is an opening 373 to form the grooves 10 (FIG. 4O).

Metal plating, such as electrolytic copper plating, is performed to adhere metal film 21, 22, each having a conductive core, to openings 381, 382 in the mask layer 380, and to adhere a metal layer 20 to opening 383 in the mask layer 380 (FIG. 4P). While not shown in the drawings, the peripheral side surfaces without an adjacent printed circuit board (without a groove 10) of the printed circuit boards 150, 160, 170, 180, etc. on the periphery of the printed circuit board assembly 100 do not have mask layer 380. They are instead coated with a metal layer using metal plating.

The mask layer 380 is removed, and metal film 375 is removed, for example, by etching the entire metal surface using flash etching. At this time, metal layers 20, 21 and 22 are etched but remain. This forms metal layers 21, 22 with a conductive core, and metal layer 20 which conforms to the shapes of openings 373, 383 where groove 10 is formed (FIG. 4Q).

A protective film 30 such as a solder protective film is formed on the surface of metal layers 20, 21 and 22. Exposure and development are performed, and a predetermined pattern is formed in the protective film 30 having an opening 60 for the openings 40, 50 used to establish an electrical connection with the devices mounted there, and for the groove 10 (FIG. 4R).

The support base 300 used to support the printed circuit board is removed, and the metal film 310 on the surface of the board where the support base was removed is removed by etching the entire metal surface using, for example, flash etching (FIG. 4S). At this time, metal layers 330, 331 and 332 are etched, but remain.

The printed circuit board assembly is placed on a dicer stage 200, and the assembly is cut into individual printed circuit boards by piece-cutting the metal layer 330 on the bottom of the grooves 10 using, for example, a dicer (FIG. 4T). The dicer stage 200 has recesses 210 where the metal layer 330 is to be cut.

In various embodiments of the present invention, the peripheral side surfaces of each printed circuit board are covered by a metal layer when the wiring layer is formed, and are not exposed when the individual printed circuit boards are cut and separated. In other words, the peripheral side surfaces are completely protected. The process of coating the peripheral side surfaces of the printed circuit board is not performed after the printed circuit boards have been cut and separated, but is incorporated into the process of forming the wiring layer. As a result, the manufacturing process is more efficient and requires less labor.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

The invention claimed is:

1. A printed circuit board assembly comprising:
    a first metal layer formed upon a top surface of a support base in a predetermined pattern, the first metal layer defines boundary ends between adjacent printed circuit boards in the printed circuit board assembly;
    a wiring structure portion formed upon the top of the first metal layer, the wiring structure portion comprising an insulating layer and a conductive layer for each printed circuit board in the printed circuit board assembly;
    grooves formed in the wiring structure portion, the grooves having a pattern corresponding to the first metal layer pattern to expose the first metal layer;
    a second metal layer formed upon a wall surface of the grooves.

2. The printed circuit board assembly of claim 1, wherein the grooves are formed in the wiring structure portion using a laser drill.

3. The printed circuit board assembly of claim 1, wherein the second metal layer further comprises:
    a metal film formed on an inside surface of the grooves and on a surface of the wiring structure portion, and;
    a mask layer formed on the metal film, the mask layer comprising an opening in the grooves.

4. The printed circuit board assembly of claim 1, wherein the first metal layer is cut on a bottom surface of the grooves to separate each printed circuit board using a dicer.

5. A manufacturing method for a printed circuit board comprising:
    forming on a top surface of a support base, in a pattern having a predetermined width, a first metal layer for defining boundary ends between adjacent printed circuit boards in a printed circuit board assembly;
    forming on top of the first metal layer a wiring structure portion having an insulating layer and a conductive layer for each printed circuit board in the printed circuit board assembly;
    forming, in the wiring structure portion, grooves having a pattern corresponding to the pattern of the first metal layer to expose the first metal layer;
    forming a second metal layer on the wall surface of the grooves in the wiring structure portion; and
    cutting the first metal layer on the bottom surface of the grooves to separate each printed circuit board.

6. The method according to claim 5, wherein forming the grooves in the wiring structure portion further comprises:
    forming the grooves in the wiring structure portion using a laser drill.

7. The method according to claim 5, wherein forming the second metal layer on the wall surface of the grooves in the wiring structure portion further comprises:
    forming a metal film on the inside surface of the grooves and on the surface of the wiring structure portion using electroless metal plating;
    forming on the metal film a mask layer having an opening in the grooves;
    forming the second metal layer on the metal film inside the grooves using electrolytic metal plating; and
    removing the mask layer, and then removing the metal film by etching the entire metal surface.

8. The method according to claim 5, wherein cutting the first metal layer on the bottom surface of the grooves to separate each printed circuit board further comprises:
    piece-cutting the first metal film using a dicer.

* * * * *